(12) United States Patent
Leobandung et al.

(10) Patent No.: US 10,872,954 B2
(45) Date of Patent: Dec. 22, 2020

(54) SIDEWALL IMAGE TRANSFER NANOSHEET

(71) Applicant: Tessera, Inc., San Jose, CA (US)

(72) Inventors: Effendi Leobandung, Stormville, CA (US); Tenko Yamashita, Schenectady, NY (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 16/853,161

(22) Filed: Apr. 20, 2020

(65) Prior Publication Data

US 2020/0251556 A1 Aug. 6, 2020

Related U.S. Application Data

(60) Continuation of application No. 16/103,085, filed on Aug. 14, 2018, now Pat. No. 10,629,680, which is a
(Continued)

(51) Int. Cl.
*H01L 29/423* (2006.01)
*H01L 29/06* (2006.01)
(Continued)

(52) U.S. Cl.
CPC .... *H01L 29/0673* (2013.01); *H01L 21/02603* (2013.01); *H01L 21/3085* (2013.01); *H01L 21/3086* (2013.01); *H01L 21/30604* (2013.01); *H01L 21/823807* (2013.01); *H01L 21/823828* (2013.01); *H01L 21/823857* (2013.01); *H01L 27/092* (2013.01); *H01L 29/0665* (2013.01); *H01L 29/0676* (2013.01); *H01L 29/165* (2013.01); *H01L 29/42392* (2013.01); *H01L 29/6656* (2013.01); *H01L 29/66545* (2013.01);
(Continued)

(58) Field of Classification Search
CPC ..... H01L 29/0665; H01L 29/0669–068; H01L 29/7853–2029/7858; H01L 29/78687; H01L 29/78696; H01L 29/41725–41791; H01L 29/7839; H01L 29/806; H01L 2924/13061; H01L 29/66439; H01L 29/66469; H01L 29/42392; Y10S 977/938
See application file for complete search history.

(56) References Cited

U.S. PATENT DOCUMENTS 7,892,945 B2 2/2011 Bedell et al.
8,679,902 B1 3/2014 Basker et al.
(Continued)

OTHER PUBLICATIONS

List of IBM Patents or Patent Applications Treated As Related (Appendix P), Filed Aug. 14, 2018, 2 pages.

*Primary Examiner* — Scott B Geyer
(74) *Attorney, Agent, or Firm* — Lee & Hayes, P.C.

(57) ABSTRACT

A method for forming active regions of a semiconductor device comprising forming a nanosheet stack on a substrate, forming the nanosheet stack comprising forming a sacrificial nanosheet layer on the substrate, and forming a nanosheet layer on the sacrificial nanosheet layer, forming an etch stop layer on the nanosheet stack, forming a mandrel layer on the etch stop layer, removing portions of the mandrel layer to form a mandrel on the etch stop layer, forming sidewalls adjacent to sidewalls of the mandrel, depositing a fill layer on exposed portions of the etch stop layer, removing the sidewalls and removing exposed portions of the etch stop layer and the nanosheet stack to expose portions of the substrate.

19 Claims, 9 Drawing Sheets

Related U.S. Application Data continuation of application No. 15/593,933, filed on May 12, 2017, now Pat. No. 10,170,551, which is a division of application No. 14/979,916, filed on Dec. 28, 2015, now Pat. No. 9,722,022.

(51) Int. Cl.

| | | |
|---|---|---|
| *H01L 21/02* | (2006.01) | |
| *H01L 21/308* | (2006.01) | |
| *H01L 21/306* | (2006.01) | |
| *H01L 29/66* | (2006.01) | |
| *H01L 29/78* | (2006.01) | |
| *H01L 29/786* | (2006.01) | |
| *H01L 21/8238* | (2006.01) | |
| *H01L 27/092* | (2006.01) | |
| *H01L 29/165* | (2006.01) | |
| *H01L 29/49* | (2006.01) | |

(52) U.S. Cl.
CPC .. *H01L 29/66742* (2013.01); *H01L 29/66795* (2013.01); *H01L 29/785* (2013.01); *H01L 29/78696* (2013.01); *H01L 21/823814* (2013.01); *H01L 21/823842* (2013.01); *H01L 21/823864* (2013.01); *H01L 29/49* (2013.01)

(56) References Cited

U.S. PATENT DOCUMENTS

| | | |
|---|---|---|
| 8,753,942 B2 | 6/2014 | Kuhn et al. |
| 8,969,149 B2 | 3/2015 | Leobandung |
| 9,437,502 B1 | 9/2016 | Cheng et al. |
| 9,577,038 B1 | 2/2017 | Doris et al. |
| 9,722,022 B2 | 8/2017 | Leobandung et al. |
| 2010/0207208 A1 | 8/2010 | Bedell et al. |
| 2014/0001441 A1 | 1/2014 | Kim et al. |
| 2014/0042386 A1 | 2/2014 | Cea et al. |
| 2014/0339611 A1 | 11/2014 | Leobandung |
| 2015/0090958 A1 | 4/2015 | Yang et al. |
| 2015/0108573 A1 | 4/2015 | Liu et al. |
| 2016/0111337 A1 | 4/2016 | Hatcher et al. |
| 2017/0005168 A1 | 1/2017 | Doornbos et al. |
| 2017/0186842 A1 | 6/2017 | Leobandung et al. |
| 2017/0250251 A1 | 8/2017 | Leobandung et al. |
| 2018/0138289 A1 | 5/2018 | Rachmady et al. |
| 2018/0212023 A1 | 7/2018 | Weber et al. |
| 2018/0358436 A1 | 12/2018 | Jambunathan et al. |

SIDEWALL IMAGE TRANSFER NANOSHEET

CROSS-REFERENCE TO RELATED APPLICATION

This application is a continuation of and claims priority to U.S. patent application Ser. No. 16/103,085, filed Aug. 14, 2018, which is a continuation of U.S. patent application Ser. No. 15/593,933, filed May 12, 2017, now U.S. Pat. No. 10,170,551, issued Jan. 1, 2019, which is a divisional application of U.S. patent application Ser. No. 14/979,916, filed Dec. 28, 2015, now U.S. Pat. No. 9,722,022, issued Aug. 1, 2017, the contents of which are incorporated by reference herein in their entirety.

BACKGROUND

The present invention generally relates to metal-oxide-semiconductor field-effect transistors (MOSFET), and more specifically, to nanosheet gate all around devices.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("of") or a resistive path ("on").

N-type field effect transistors (nFET) and p-type field effect transistors (pFET) are two types of complementary MOSFETs. The nFET uses electrons as the current carriers and with n-doped source and drain junctions. The pFET uses holes as the current carriers and with p-doped source and drain junctions.

Nanosheet devices are FET devices that have a relatively thin and substantially planar channel region formed from a semiconductor material. The channel region is surrounded on all sides by a metal gate to form a gate all around device.

SUMMARY

According to an embodiment of the present invention, a method for forming active regions of a semiconductor device comprises forming a nanosheet stack on a substrate, forming the nanosheet stack comprising forming a sacrificial nanosheet layer on the substrate, and forming a nanosheet layer on the sacrificial nanosheet layer, forming an etch stop layer on the nanosheet stack, forming a mandrel layer on the etch stop layer, removing portions of the mandrel layer to form a mandrel on the etch stop layer, forming sidewalls adjacent to sidewalk of the mandrel, depositing a fill layer on exposed portions of the etch stop layer, removing the sidewalls and removing exposed portions of the etch stop layer and the nanosheet stack to expose portions of the substrate.

According to another embodiment of the present invention, a method for a semiconductor device comprises forming a nanosheet stack on a substrate, forming the nanosheet stack comprising forming a sacrificial nanosheet layer on the substrate, and forming a nanosheet layer on the sacrificial nanosheet layer, forming an etch stop layer on the nanosheet stack, forming a mandrel layer on the etch stop layer, removing portions of the mandrel layer to form a mandrel on the etch stop layer, forming sidewalls adjacent to sidewalls of the mandrel, depositing a fill layer on exposed portions of the etch stop layer, removing the sidewalls, removing exposed portions of the etch stop layer and the nanosheet stack to expose portions of the substrate, removing the mandrel, the fill layer, and the etch stop layer, forming a gate stack over the nanosheet stack, and removing exposed portions of the sacrificial nanosheet layer of the nanosheet stack.

According to yet another embodiment of the present invention, a semiconductor device comprises a substrate, a first semiconductor nanosheet arranged over the substrate, a second semiconductor nanosheet arranged over the substrate, the second semiconductor nanosheet arranged adjacent to the first semiconductor nanosheet and separated by a gap having a gap length of approximately 2-10 nm, a gate stack arranged over the substrate and channel regions of the first semiconductor nanosheet and the second semiconductor nanosheet.

BRIEF DESCRIPTION OF THE DRAWINGS

FIG. 1 illustrates side view of a substrate and nanosheets arranged on the substrate.

FIG. 2 illustrates a side view following the formation of an etch stop layer that is deposited on the stack of nanosheets and a mandrel layer.

FIG. 3 illustrates a side view following a lithographic patterning and etching process that removes portions of the mandrel layer to form mandrels on the etch stop layer.

FIG. 4 illustrates a side view following the deposition of a fill layer on exposed surfaces of the etch stop layer.

FIG. 5 illustrates a side view following a suitable selective etching process.

FIG. 6 illustrates a side view of the resultant structure following a selective etching process such as, for example, reactive ion etching that removes exposed portion of the etch stop layer and exposed portions of the nanowire stack.

FIG. 7 illustrates the resultant structure following the removal of the mandrels, the fill layer, and the etch stop layer to expose the nanosheet stack.

FIG. 8 illustrates a top view the resultant structure following the removal of the mandrels, the fill layer, and the etch stop layer to expose the nanosheet stack.

FIG. 9 illustrates a top view following the formation of sacrificial gate stack and spacers adjacent to the sacrificial gate stacks.

FIG. 10 illustrates a cutaway view along the line A-A of FIG. 9 that shows the sacrificial gate stack arranged over the nanosheet stack and the substrate.

FIG. 11 illustrates a top view of the resultant structure following a selective isotropic etching process that removes exposed portions of the nanosheets to form vertically arranged active regions.

FIG. 12 illustrates a cutaway view along the line B-B of FIG. 11.

FIG. 13 illustrates a top view following the formation of source/drain regions over exposed portions of the active region nanosheets of FIG. 12.

FIG. 14 illustrates a cutaway view along the line B-B of FIG. 13.

FIG. 15 illustrates a top view following the removal of the sacrificial gate stack of FIG. 13, which exposes channel regions of the active region nanosheets.

FIG. 16 illustrates a top view following the formation of a replacement metal gate stack.

FIG. 17 illustrates a cutaway view along the line C-C of FIG. 16.

DETAILED DESCRIPTION

Nanosheet devices are FET devices that have a relatively thin and substantially planar channel region formed from a semiconductor material. The channel region is surrounded on all sides by a metal gate to form a gate all around device.

In some FET devices, such as finFETs, the active regions are defined using a sidewall image transfer process. Generally, a sidewall image transfer process includes patterning a hardmask mandrel on a semiconductor material, and forming sidewalls similar to spacers adjacent to the mandrel. The mandrel may then be removed, such that the sidewalls remain. The sidewalls act as a mask to allow patterning of the remaining exposed semiconductor material to form fins. Such methods for forming fins form thin tall active region fin structures. However, using such methods to form nanosheet active regions is challenging, because it is desirable to form nanosheets that are relatively wide with tight spacing between adjacent nanosheets.

The methods described herein provide for the formation of nanosheets that are relatively thin, are relatively wide, and are tightly spaced.

FIGS. 1-17 illustrate an exemplary method for fabricating a nanosheet device on a substrate.

Figure 1:
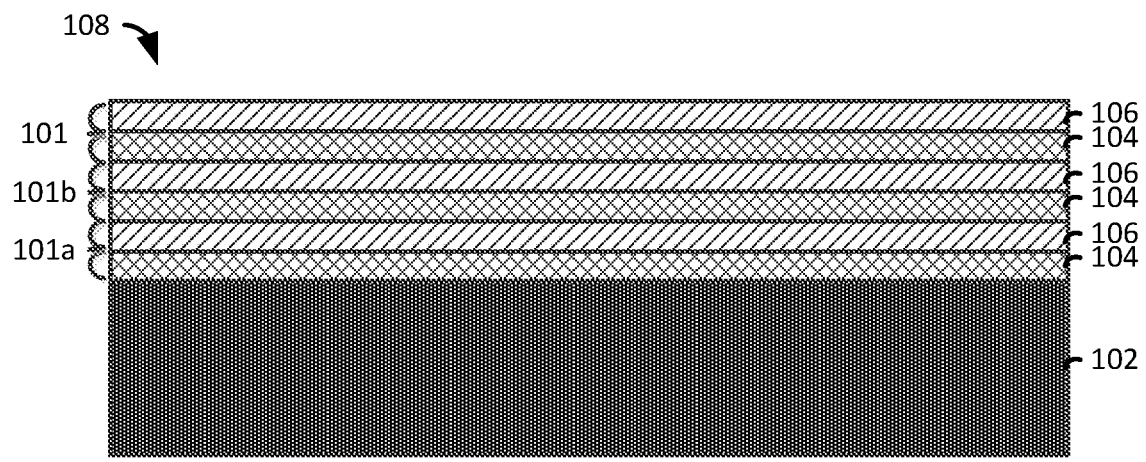
FIGS. 1-17 illustrate an exemplary method for fabricating a nanosheet device on a substrate.

FIG. 1 illustrates side view of a substrate 102 and nanosheets 104 and 106 arranged on the substrate 102. Non-limiting examples of suitable substrate materials include Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof. Other examples of suitable substrates include silicon-on-insulator (SOI) substrates with buried oxide (BOX) layers.

A stack of nanosheets 108 is arranged on the substrate 102. The stack of nanosheets 108 includes pairs 101 of nanosheets 104 and 106, where the first sacrificial nanosheet 104 of pair 101a is arranged on the substrate 102 and the second nanosheet 106 is arranged on the first nanosheet 104. A second pair of nanosheets 101b is arranged on the first pair of nanosheets 101. Any number of pairs 101 may be arranged on the substrate 102. The nanosheets 104 and 106 may include any suitable semiconductor material. In the illustrated embodiment, the nanosheets 104 and 106 are dissimilar materials. The semiconducting material of the nanosheets 104 and 106 can include, but is not limited to, Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

The nanosheets 104 and 106 may be formed by, for example, an epitaxial growth process. The epitaxial growth process deposits a crystalline layer onto a crystalline substrate beneath. The underlying substrate acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process.

Figure 2:
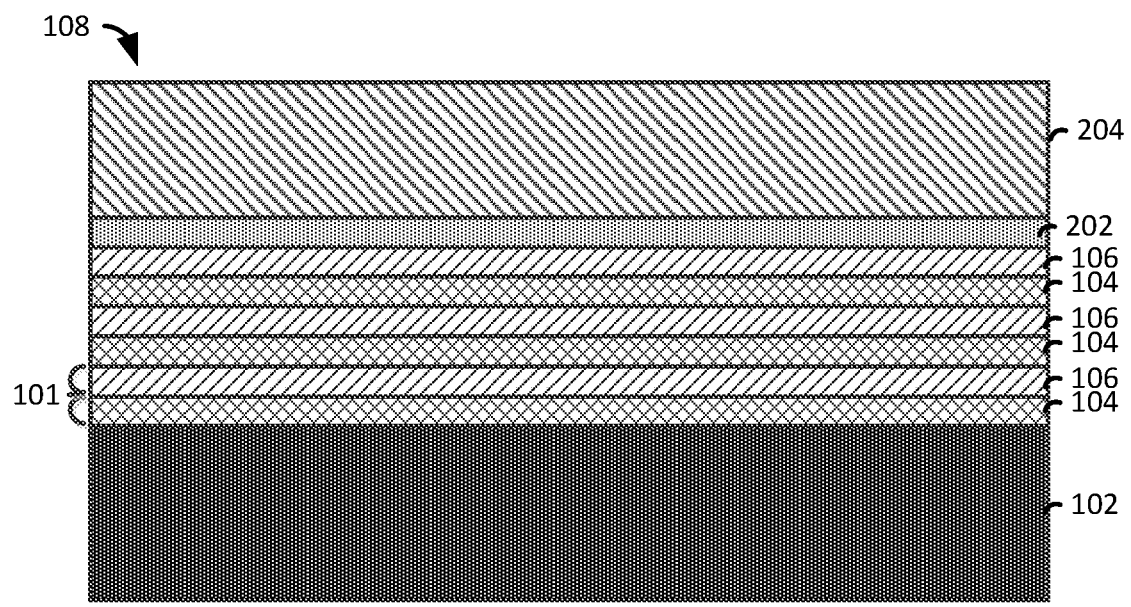

FIG. 2 illustrates a side view following the formation of an etch stop layer 202 that is deposited on the stack of nanosheets 108. Mandrel layer 204 is deposited on the etch stop layer 202. The mandrel layer 204 may be formed from, for example, a polysilicon material. The etch stop layer 202 may include, for example, an oxide or nitride material. Non-limiting examples of suitable oxide materials for the etch stop layer 202 include silicon dioxide, tetraethylorthosilicate (TEOS) oxide, high aspect ratio plasma (HARP) oxide, silicon oxide, high temperature oxide (HTO), high density plasma (HDP) oxide, dielectric nitrides e.g, silicon nitride), dielectric oxynitrides, oxides formed by an atomic layer deposition (ALD) process, or any combination thereof.

Figure 3:
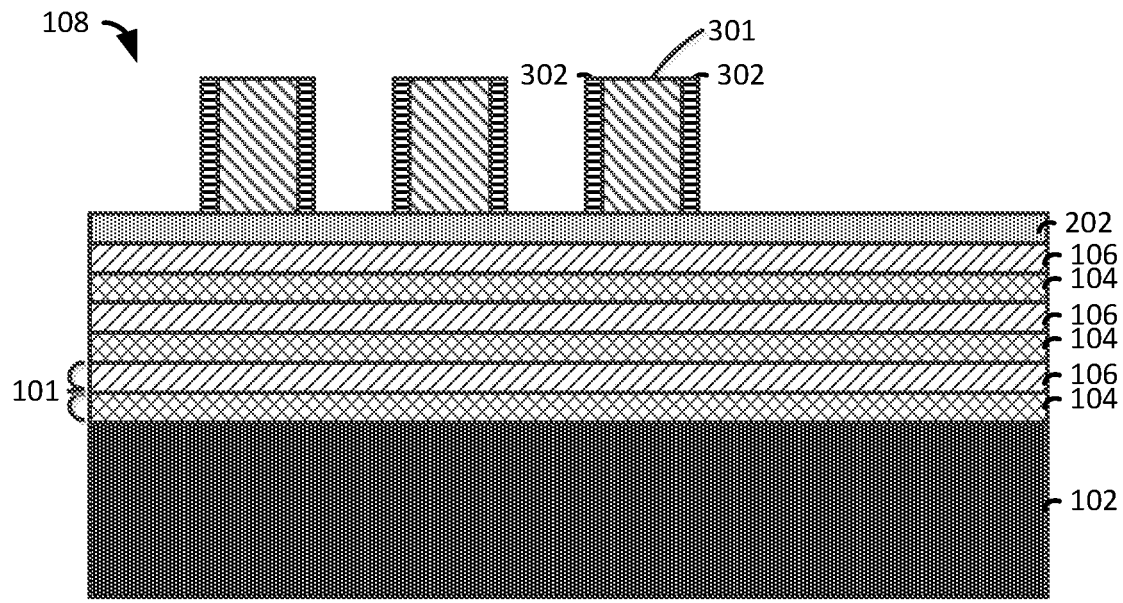

FIG. 3 illustrates a side view following a lithographic patterning and etching process that removes portions of the mandrel layer 204 to form mandrels 301 on the etch stop layer 202. The mandrels 301 are formed by a suitable lithographic and selective etching process such as, for example, reactive ion etching (RIE) that selectively removes exposed portions of the mandrel layer 204 (of FIG. 2). Following the formation of the mandrels 301, sidewalk 302 are formed adjacent to sidewalk of the mandrel 301. The sidewalls 302 may be formed by, for example, depositing a layer of nitride material and performing an etching process such as, for example, RIE that removes portions of the layer of nitride material to form the sidewalls 302.

Figure 4:
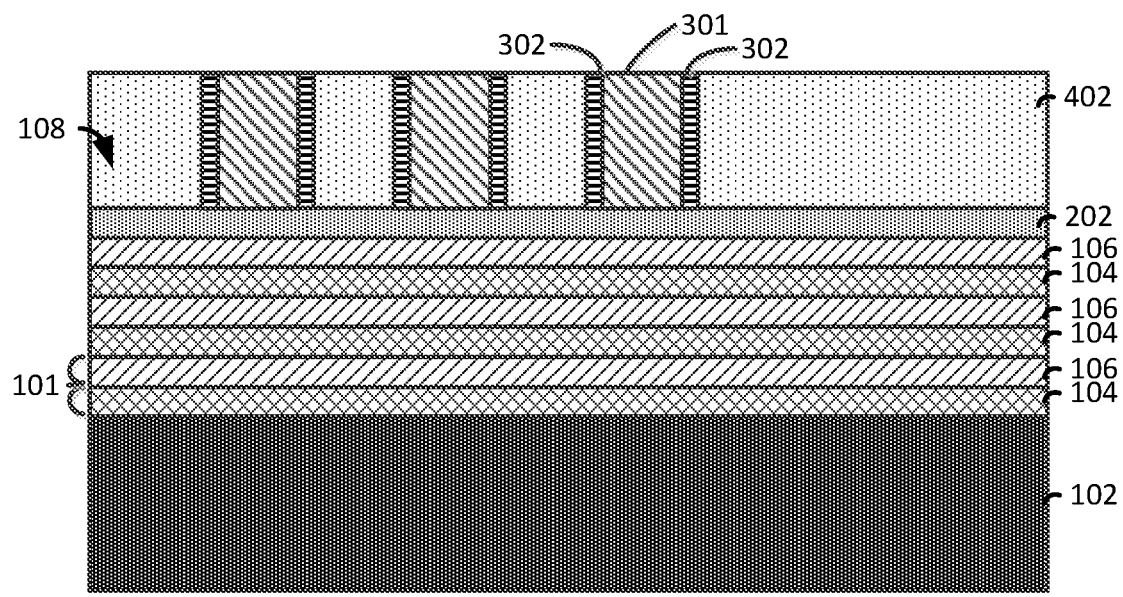

FIG. 4 illustrates a side view following the deposition of a fill layer 402 on exposed surfaces of the etch stop layer 202. The fill layer 402 may include, for example, spin on glass, chemical vapor deposition oxide or another suitable material. Following the deposition of the fill layer 402, a planarization process such as, for example, chemical mechanical polishing may be performed to reduce the height of the fill layer 402 and expose the sidewalls 302 and the mandrels 301.

Figure 5:
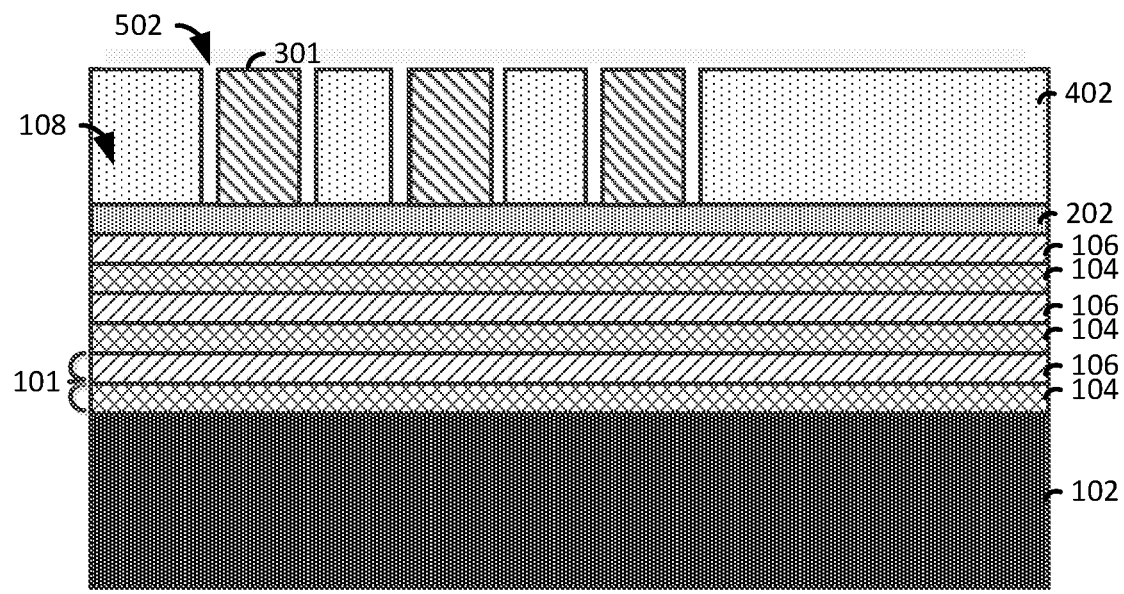

FIG. 5 illustrates a side view following a suitable selective etching process, such as, for example, reactive ion etching, or a wet etching process that removes exposed portions of the sidewalls 302 (of FIG. 4). The etching process form cavities 502 that expose portions of the etch stop layer 202.

Figure 6:
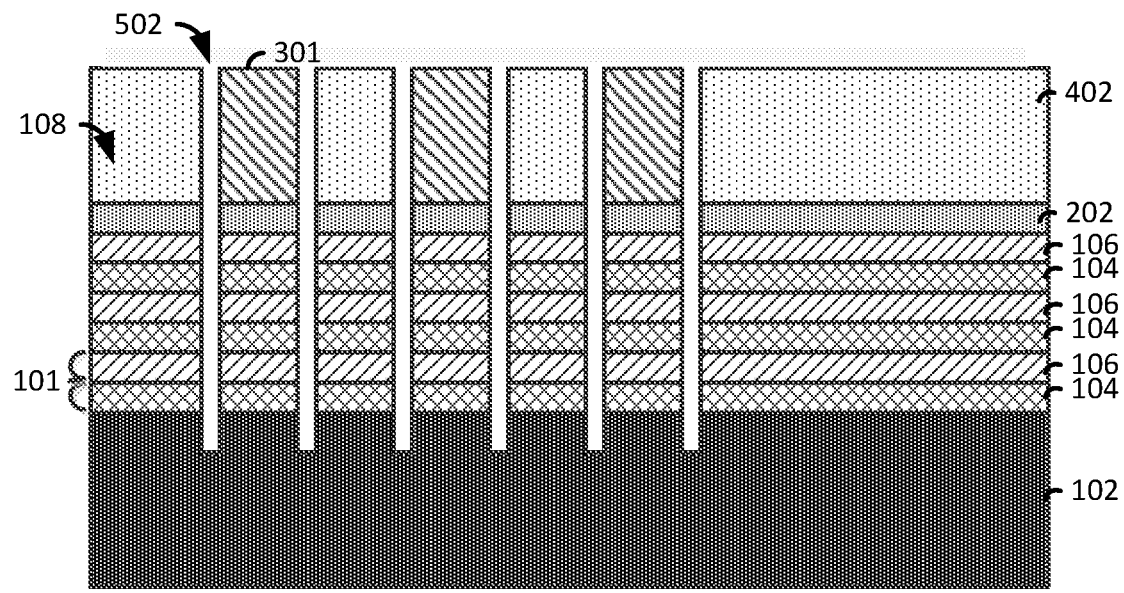

FIG. 6 illustrates a side view of the resultant structure following a selective etching process such as, for example, reactive ion etching that removes exposed portion of the etch stop layer 202 and exposed portions of the nanowire stack 108 to increase the depth of the cavities 502 and expose portions of the substrate 102.

Figure 7:
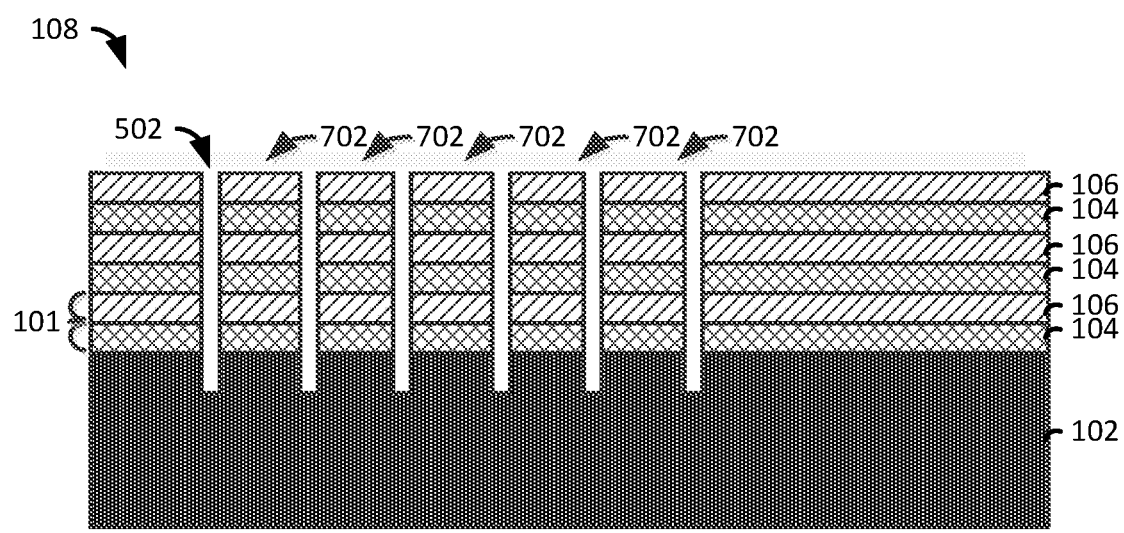

FIG. 7 illustrates the resultant structure following the removal of the mandrels 301, the fill layer 402, and the etch stop layer 202 to expose the nanosheet stack 108. The mandrels 301, the fill layer 402, and the etch stop layer 202 may be removed by, for example, a selective etching process or a planarization process. The stacks 702 represent nanosheets that will form active regions of the device following subsequent fabrication processes described below.

Figure 8:
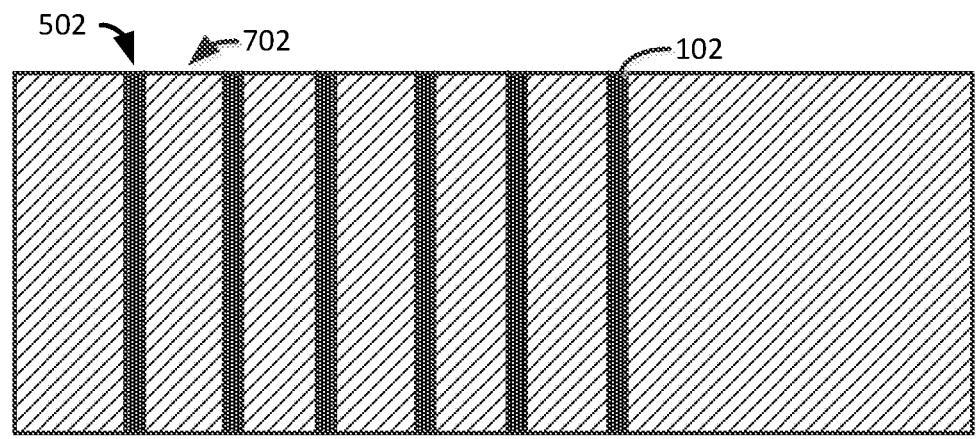

FIG. 8 illustrates a top view the resultant structure following the removal of the mandrels 301, the fill layer 402, and the etch stop layer 202 to expose the nanosheet stack 108.

Figure 9:
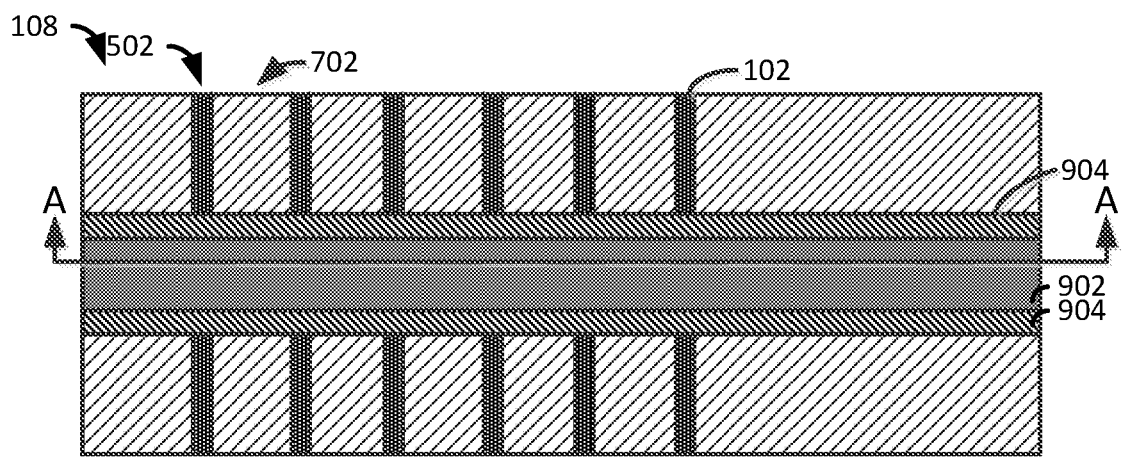

FIG. 9 illustrates a top view following the formation of sacrificial gate stack 902 and spacers 904 adjacent to the sacrificial gate stack 902. The sacrificial gate stacks 902 may be formed by, for example, depositing a layer of polysilicon, amorphous silicon, or oxide material over the nanosheet stack 108. A lithographic patterning and etching process, such as, for example, reactive ion etching is performed to remove portions of the layer of sacrificial gate stack material and define the sacrificial gate stack 902.

Following the formation of the sacrificial gate stack 902, spacers 904 are formed along sidewalls of the sacrificial gate stack 902. The spacers 904 may include, for example, a nitride or oxide material that is deposited in a layer and etched using, for example reactive ion etching to form the spacers 904.

Figure 10:
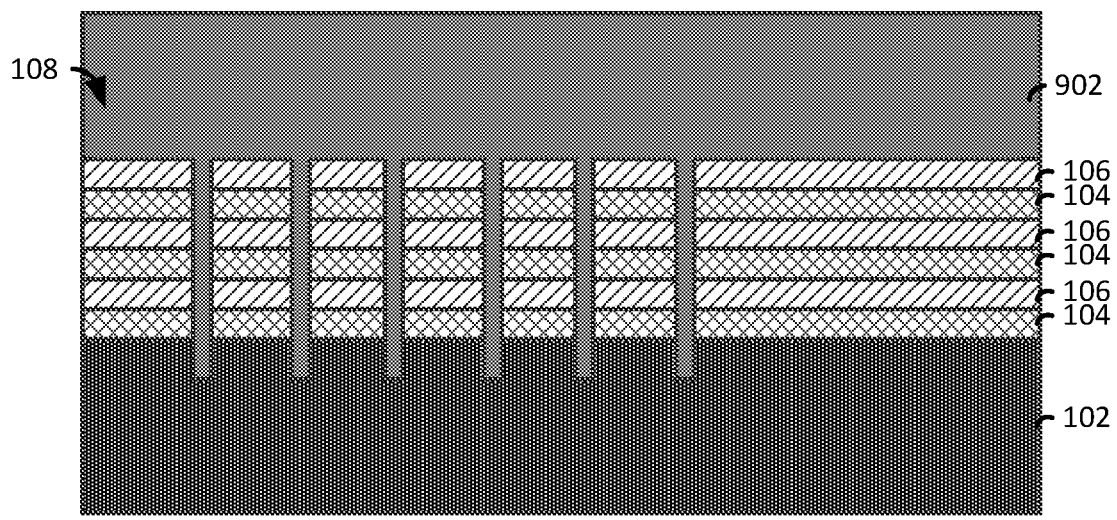

FIG. 10 illustrates a cutaway view along the line A-A of FIG. 9 that shows the sacrificial gate stack 902 arranged over the nanosheet stack 108 and the substrate 102.

Figure 11:
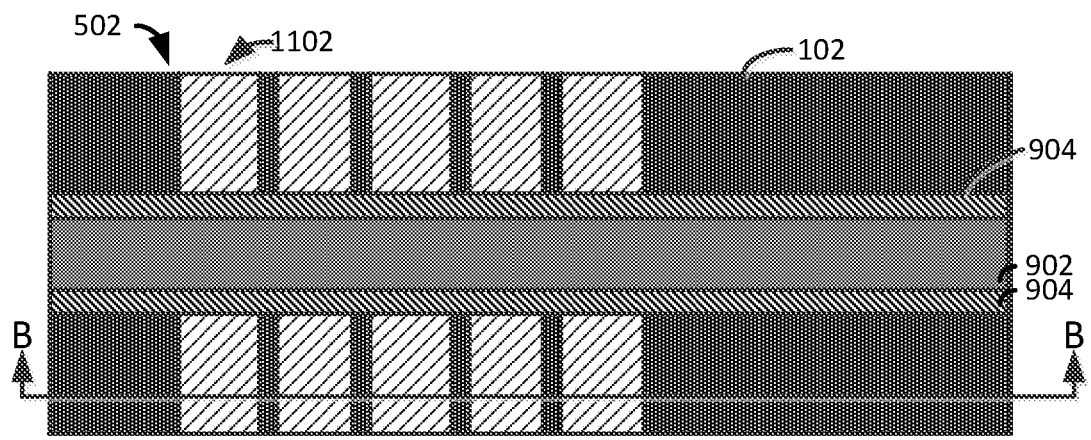

FIG. 11 illustrates a top view of the resultant structure following a selective isotropic etching process that removes exposed portions of the nanosheets 104 to form vertically arranged active regions 1102. The etching process may include, for example, a wet etching process that selectively removes exposed portions of the nanosheets 104 without substantially removing portions of the nanosheets 106. For illustrative purposes portions of the nanosheets 106 have been removed from this and the following figures to clearly the vertically arranged active regions 1102.

Figure 12:
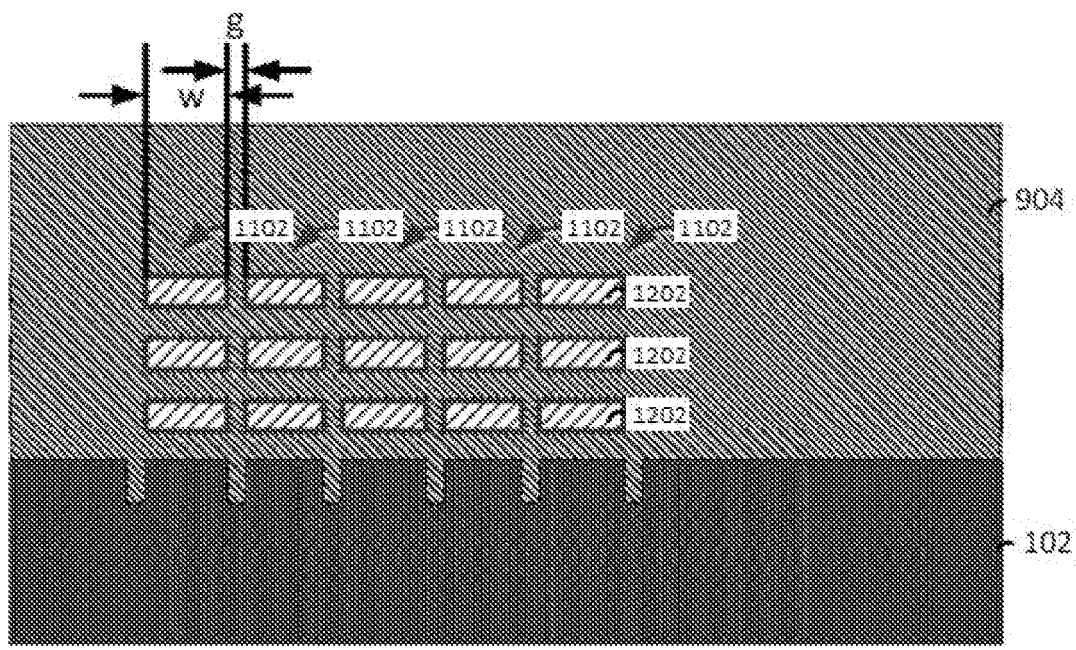

FIG. 12 illustrates a cutaway view along the line B-B of FIG. 11. FIG. 12 shows the active region nanosheets 1202 of the vertically arranged active regions 1102. FIG. 12 shows a gap (g) defined by edges of the nanosheets 1202. The nanosheets 1202 have a width (w) that is approximately 10-50 nm. The length of the gap is less than approximately 2-10 nm.

Figure 13:
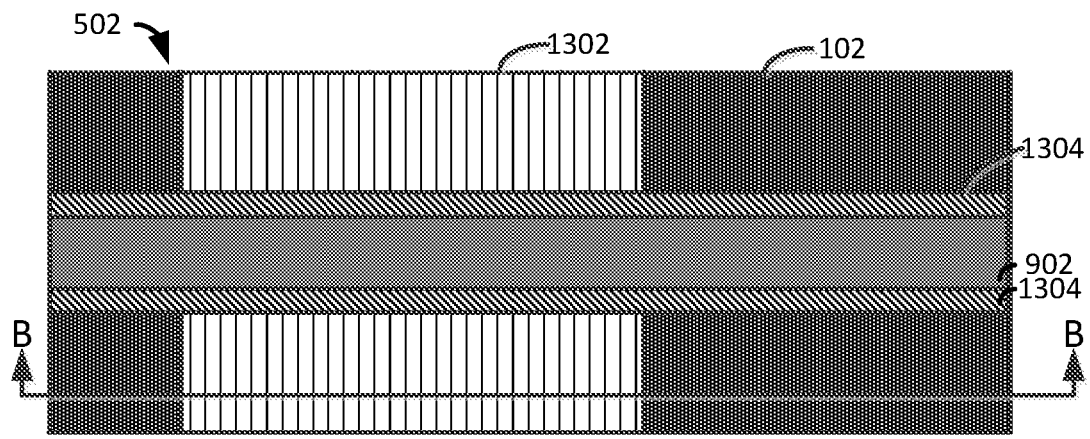

FIG. 13 illustrates a top view following the formation of source/drain regions 1302 over exposed portions of the active region nanosheets 1202 (of FIG. 12). The underlying active region nanosheets 1202 act as seed crystals. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of device.

Prior to forming the source/drain regions 1302, the spacers 904 (of FIG. 12) are removed using a suitable selective etching process and a new set of spacers 1302 are formed using a similar spacer fabrication process as described above. The spacers 1302 obscure channel portions the active region nanosheets 1202 that were partially exposed during the isotropic etching process described above that removed the sacrificial nanosheet layers 106.

Figure 14:
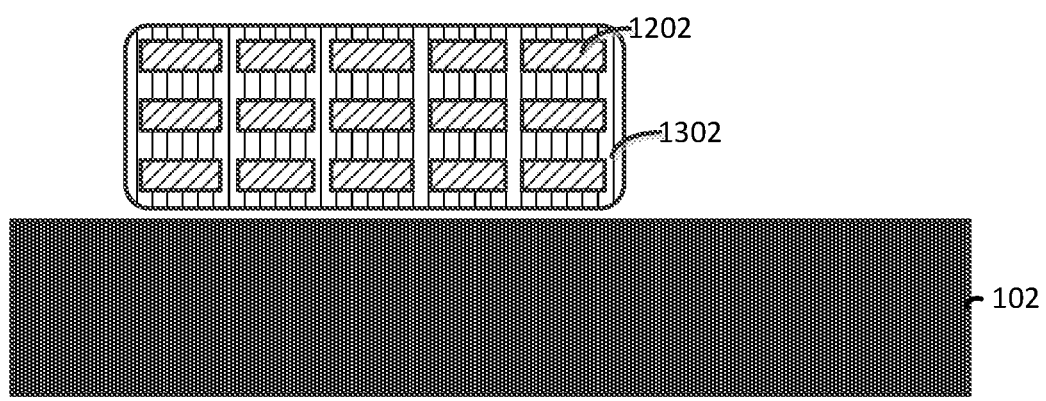

FIG. 14 illustrates a cutaway view along the line B-B of FIG. 13. FIG. 14 shows the source/drain regions 1302 grown around the exposed portions of the active region nanosheets 1202.

Figure 15:
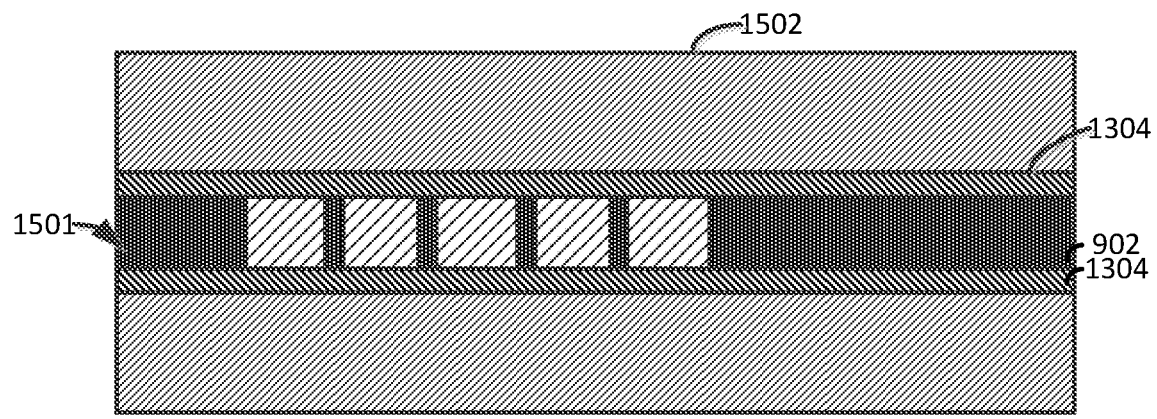

FIG. 15 illustrates a top view following the removal of the sacrificial gate stack 902 (of FIG. 13), which exposes channel regions of the active region nanosheets 1202. Prior to removing the sacrificial gate stack 902, an insulator layer 1502 that may include, for example, an oxide material is formed over exposed portions of the substrate 102 (of FIG. 13) and the source/drain regions 1302. The insulator layer 1502 may be planarized using, for example, a chemical mechanical polishing process to expose the sacrificial gate stacks 902. The sacrificial gate stack 902 may be removed using any suitable selective etching process.

Figure 16:
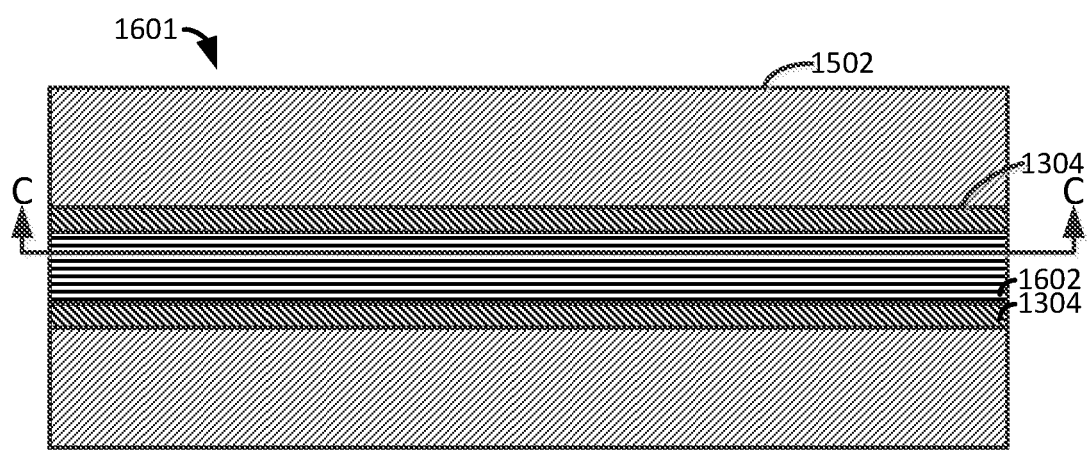
Figure 17:
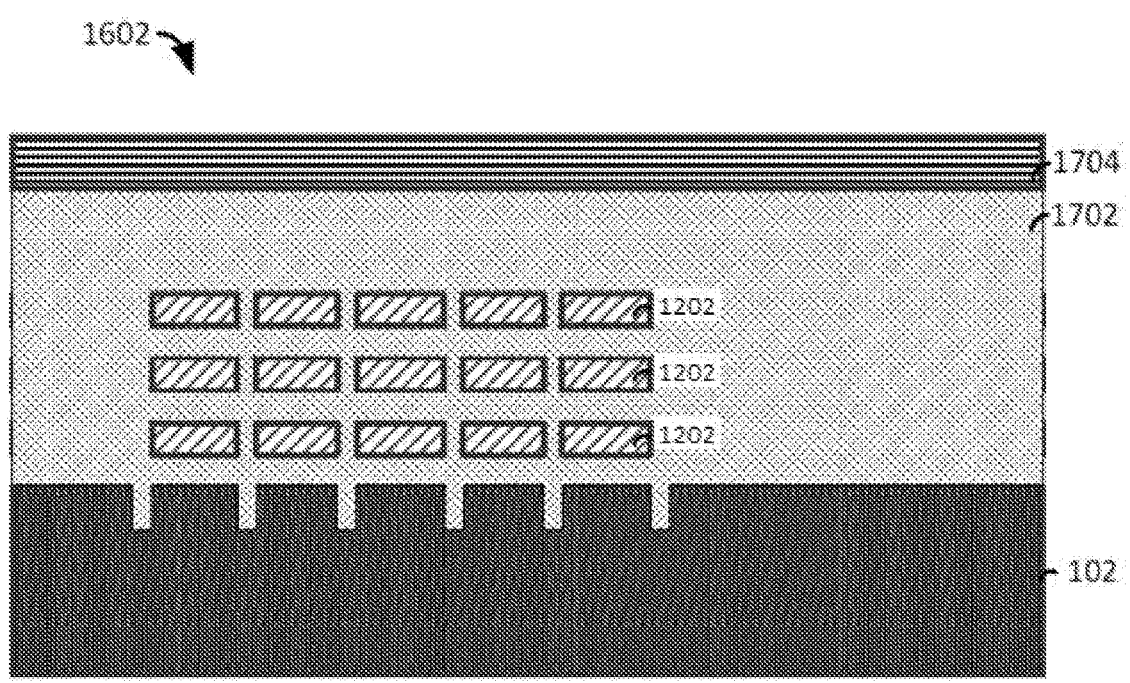

FIG. 16 illustrates a top view following the formation of a replacement metal gate stack (gate stack) 1602 resulting in a semiconductor device 1601. FIG. 17 illustrates a cutaway view along the line C-C of FIG. 16. FIG. 17 shows the gate stack 1602 arranged over and around channel regions of the active region nanosheets 1202. The gate stack 1602 includes a gate 1702 and a cap layer 1704. The gate 1702 may include any suitable material, combination of materials, or layers of materials.

The gate stack 1602 of the illustrated exemplary embodiment includes high-k metal gates formed, for example, by filling a dummy gate opening 1501 (of FIG. 15) with one or more high-k dielectric materials, one or more workfunction metals, and one or more metal gate conductor materials (collectively shown in FIG. 17 as the gate stack 1702). The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), alutninates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

The work function metal(s) may be disposed over the high-k dielectric material. The type of work function metal(s) depends on the type of transistor and may differ between the nFET 101 and the pFET 102. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A conductive metal is deposited over the high-k dielectric material(s) and workfunction layer(s) to form the gate stacks 1702. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering.

A planarization process, for example, chemical mechanical planarization (CMP), is performed to polish the surface of the conductive gate metal.

Following the formation of the gate stacks 1602, conductive contacts (not shown) may be formed to provide electrical connections to the device.

Though the illustrated embodiments show a gate last fabrication process using a sacrificial gate and replacement metal gate, alternate exemplary embodiments may include a gate first fabrication process. In such alternate embodiments, the gate stack 1602 and spacers 1304 are formed prior to the formation of the source/drain regions 1304.

The methods and resultant embodiments described herein provide for a nanosheet FET device that has vertical stacks of relatively thin and wide active regions that are closely or tightly spaced relative to each other horizontally along a substantially planar surface of the substrate 102.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a substrate;
    a first set of semiconductor nanosheets vertically disposed on the substrate, the first set of semiconductor nanosheets comprising a first channel region;
    a second set of semiconductor nanosheets vertically disposed on the substrate, the second set of semiconductor nanosheets comprising a second channel region;
    a gate stack having an elongated axis in a first direction, disposed on the substrate and over and around both the first and second channel regions;
    first source and drain regions disposed on opposite sides of the first channel region in a second direction orthogonal to the first direction;
    second source and drain regions disposed on opposite sides of the second channel region in the second direction;
    wherein the first and second channel regions are at the same level of their respective sets of semiconductor nanosheets and are separated by a distance of about 2 nanometers (nm) to about 10 nm in the first direction.

2. The structure of claim 1, wherein the first channel region has a width in the first direction of approximately 10-50 nm and the second channel region has a width in the first direction of approximately 10-50 nm.

3. The structure of claim 1, wherein the first and second sets of semiconductor nanosheets comprise epitaxially grown semiconductor material.

4. The structure of claim 1, wherein the gate stack comprises:
    a high-k dielectric; and
    a work function layer disposed over and around the high-k dielectric.

5. The structure of claim 4, wherein the high-k dielectric comprises a dopant.

6. The structure of claim 5, wherein the dopant is lanthanum.

7. The structure of claim 5, wherein the dopant is aluminum.

8. The structure of claim 1, wherein the first and second source regions comprise a merged, epitaxially grown semiconductor material.

9. The structure of claim 1, wherein the first and second drain regions comprise a merged, epitaxially grown semiconductor material.

10. A structure comprising:
    a substrate;
    a first set of semiconductor nanosheets vertically disposed on the substrate, the first set of semiconductor nanosheets comprising a first channel region;
    a second set of semiconductor nanosheets vertically disposed on the substrate, the second set of semiconductor nanosheets comprising a second channel region;
    a gate stack having an elongated axis in a first direction, disposed on the substrate and over and around both the first and second channel regions;
    first source and drain regions disposed on opposite sides of the first channel region in a second direction orthogonal to the first direction;
    second source and drain regions disposed on opposite sides of the second channel region in the second direction;

wherein the first and second channel regions are at the same level of their respective sets of semiconductor nanosheets and are separated by a sublithographic distance.

11. The structure of claim 10, wherein the sublithographic distance is about 2 nm to about 10 nm, and is formed by selectively removing a sidewall followed by an etch.

12. The structure of claim 10, wherein the first channel region has a width in the first direction of approximately 10-50 nm and the second channel region has a width in the first direction of approximately 10-50 nm.

13. The structure of claim 10, wherein the first and second sets of semiconductor nanosheets comprise epitaxially grown semiconductor material.

14. The structure of claim 10, wherein the gate stack comprises:
   a high-k dielectric; and
   a work function layer disposed over and around the high-k dielectric.

15. The structure of claim 14, wherein the high-k dielectric comprises a dopant.

16. The structure of claim 15, wherein the dopant is lanthanum.

17. The structure of claim 15, wherein the dopant is aluminum.

18. The structure of claim 10, wherein the first and second source regions comprise a merged, epitaxially grown semiconductor material.

19. The structure of claim 10, wherein the first and second drain regions comprise a merged, epitaxially grown semiconductor material.

* * * * *